(12) United States Patent
Borisov et al.

(10) Patent No.: US 8,735,955 B2
(45) Date of Patent: May 27, 2014

(54) GROUNDING SYSTEM AND APPARATUS

(75) Inventors: Konstantin Borisov, York, PA (US);
Michael S. Todd, Jacobus, PA (US);
Shreesha Adiga-Manoor, York, PA (US); Ivan Jadric, York, PA (US)

(73) Assignee: Johnson Controls Technology Company, Holland, MI (US)

( * ) Notice: Subject to any disclaimer, the term of this patent is extended or adjusted under 35 U.S.C. 154(b) by 602 days.

(21) Appl. No.: 12/999,818

(22) PCT Filed: Jul. 8, 2009

(86) PCT No.: PCT/US2009/049876
§ 371 (c)(1),
(2), (4) Date: Dec. 17, 2010

(87) PCT Pub. No.: WO2010/008974
PCT Pub. Date: Jan. 21, 2010

(65) Prior Publication Data
US 2011/0101907 A1 May 5, 2011

Related U.S. Application Data

(60) Provisional application No. 61/081,933, filed on Jul. 18, 2008.

(51) Int. Cl.
*H01L 27/108* (2006.01)
*H01L 29/66* (2006.01)
*H01L 23/52* (2006.01)

(52) U.S. Cl.
USPC ............ 257/296; 257/577; 257/587; 257/691

(58) Field of Classification Search
USPC .................. 257/296, 577, 587, 691
See application file for complete search history.

(56) References Cited

U.S. PATENT DOCUMENTS

| | | | | |
|---|---|---|---|---|
| 6,353,353 | B1 * | 3/2002 | Nakayama | 327/382 |
| 7,993,959 | B2 * | 8/2011 | Katz et al. | 438/99 |

(Continued)

FOREIGN PATENT DOCUMENTS

| | | |
|---|---|---|
| DE | 19640488 A1 | 4/1998 |
| EP | 0734198 A2 | 9/1996 |
| WO | 2006093647 A1 | 9/2006 |

OTHER PUBLICATIONS

Liang, Zhenxian and J. D. Van Wyk, "Functional Integration in Active IPEM by Using a Planar Integration Technology", pp. 375-381, Center for Power Electronics System (CPES), Virginia Polytechnic Institute and State University, 633 Whittemore Hall (0179), Blacksburg, VA 24061 USA, Published in 2005.

*Primary Examiner* — Ngan Ngo
(74) *Attorney, Agent, or Firm* — McNees Wallace & Nurick LLC

(57) ABSTRACT

A grounding system for a semiconductor module of a variable speed drive includes a first conductive layer, a second conductive layer; a substrate disposed between the first conductive layer and the second conductive layer; and a base attached to the second conductive layer, the base being connected to earth ground via a grounding harness. The first conductive layer is in electrical contact with the semiconductor module and the substrate, and electrically insulated from the second conductive layer by the substrate. The second conductive layer is in electrical contact with the substrate and disposed between the substrate and the base in electrical communication with an earth ground. The first conductive layer, the substrate and the second conductive layer form a capacitance path between the semiconductor module and the base as well as electrical conductors and the base for reduction circulating currents within the semiconductor module.

19 Claims, 6 Drawing Sheets

(56) References Cited

U.S. PATENT DOCUMENTS

| | | |
|---|---|---|
| 8,395,234 B2 * | 3/2013 | Okushima et al. ............ 257/531 |
| 2002/0162673 A1 | 11/2002 | Cook et al. |
| 2011/0049672 A1 * | 3/2011 | Okushima et al. ............ 257/531 |
| 2013/0147011 A1 * | 6/2013 | Okushima et al. ............ 257/531 |

* cited by examiner

GROUNDING SYSTEM AND APPARATUS

CROSS-REFERENCE TO RELATED APPLICATIONS

This application claims priority from and the benefit of U.S. Provisional Application No. 61/081,933, entitled GROUNDING SYSTEM AND APPARATUS, filed Jul. 18, 2008, which is hereby incorporated by reference.

BACKGROUND

The application generally relates to grounding systems. The application relates more specifically to grounding systems for semiconductor power components with a nonconductive heatsink.

Variable speed drives (VSDs) used for heating, ventilation, air-conditioning and refrigeration (HVAC&R) applications can use heat sinks or cooling blocks for mounting and thermal management of semiconductor devices, for example, insulated gate bipolar transistor semiconductor switches. The heat sink can be constructed of metal that has a high coefficient of thermal conductivity, for example, copper. However, metal heat sinks can be expensive due to material and labor costs associated with manufacturing the heat sink. VSDs may also use heat sinks constructed of nonmetallic materials, for example, plastic, which reduce material costs. The use of plastic heat sinks, however, may still require costly machining, as plastic heat sinks typically are not suitable for injection molding manufacturing because of their large size and low usage quantities. The size of a particular heat sink is usually determined by the number of semiconductor components which are to be mounted on the heat sink.

One type of semiconductor component that can be mounted on a heat sink is a semiconductor module. A semiconductor module may include a base on which one or more semiconductor devices are mounted. The base of the semiconductor module and an upper conductive layer of the semiconductor module can be separated by a substrate layer disposed between the individual semiconductor devices and the base. Semiconductor devices, or chips, used in semiconductor modules may include insulated-gate bipolar transistors (IGBT), bipolar junction transistors (BJT), metal-oxide semiconductor field-effect transistors (MOSFET), semiconductor controlled rectifier (SCR), and other suitable three terminal semiconductor devices. The substrate may cause there to be parasitic capacitances between semiconductor devices and the base, and between the upper conductive layer and the base.

The use of plastic heat sinks with semiconductor modules may cause parasitic currents and electrical charges to build up between the base of the semiconductor module and the current conductors within the semiconductor module. Such parasitic currents and electrical charges may interfere with control signals for the semiconductor module, thus causing some semiconductor devices within the module to enter an "ON" or conductive state when they would normally be required by the control signals to be in the "OFF" or nonconductive state. The plastic or nonconductive heat sink causes the base of the semiconductor module to be electrically isolated from the rest of the system; hence, any parasitic current induced by the rate of change of voltage applied to the module can circulate within the module, thus potentially interfering with low level control signals and causing the module to malfunction. There is therefore a need for a method and system which enables safe and reliable operation of semiconductor modules mounted onto a nonconductive heat sink.

SUMMARY

The disclosed grounding system eliminates electrical charge that may accumulate between the upper conductive layer and the base, as well as electrical charge that may accumulate between other conductors within the semiconductor module. The grounding system reduces the electrical charges accumulated on the semiconductor module, reduces parasitic currents and the abnormal operation of semiconductor devices that may result in the destruction of a semiconductor module and damage to other electronic components in which the semiconductor module may be incorporated, for example, VSDs.

One embodiment relates to a grounding system for a semiconductor module. The system includes a first conductive layer capable of being electrically connected to the semiconductor module, a second conductive layer, a substrate disposed between the first conductive layer and the second conductive layer, the substrate being electrically connected to the first conductive layer and the second conductive layer, and a base connected to the second conductive layer. The base is electrically connected to earth ground, and the base being electrically connected to the second conductive layer. The first conductive layer is electrically insulated from the second conductive layer by the substrate. The first conductive layer, the substrate and the second conductive layer form a capacitance path between the semiconductor module and the base to reduce parasitic currents generated in the semiconductor module.

Another embodiment relates to a power semiconductor apparatus. The apparatus includes a semiconductor module and associated control circuitry mounted on a base. A nonconductive heat sink is in thermal communication with the base and in fluid communication with a source of liquid. The apparatus further includes a grounding assembly that includes a first conductive layer, a second conductive layer; a substrate disposed between the first conductive layer and the second conductive layer; and a base attached to the second conductive layer, the base being connected to earth ground or other suitable voltage reference point is the VSD system via a grounding harness. The first conductive layer is in electrical contact with the semiconductor module and the substrate, and electrically insulated from the second conductive layer by the substrate. The second conductive layer is in electrical contact with the substrate and disposed between the substrate and the base in electrical communication with an earth ground. The first conductive layer, the substrate and the second conductive layer form a parasitic capacitance path between the semiconductor module and the base and between conductors and the base for reduction circulating currents within the semiconductor module.

Still another embodiment is directed to a variable speed drive. The drive includes a converter stage connected to an AC power source, a DC link connected to the converter stage, and an inverter stage connected to the DC link. The inverter stage is configured to convert a DC voltage from the DC link into an output AC power having a variable voltage and a variable frequency. The inverter further includes one or more semiconductor modules and associated control circuitry, each semiconductor module being mounted on a base. A nonconductive heat sink is disposed in thermal communication with the base and in fluid communication with a source of liquid. The inverter also includes a grounding assembly. The grounding assembly includes a first conductive layer capable of being electrically connected to the semiconductor module, a second conductive layer, a substrate disposed between the first conductive layer and the second conductive layer, the substrate being electrically connected to the first conductive layer and the second conductive layer, and a base connected to the second conductive layer. The base is electrically connected to earth ground, and the base being electrically connected to the second conductive layer. The first conductive layer is electrically insulated from the second conductive layer by the substrate. The first conductive layer, the substrate and the second conductive layer form a capacitance path between the semiconductor module and the base to reduce parasitic currents generated in the semiconductor module.

Certain advantages of the embodiments described herein are elimination of shoot-through current through the semiconductor module that may occur in variable speed drives as a result of accumulated electrical charge between base and conductive electrical paths of the semiconductor module.

DETAILED DESCRIPTION OF THE EXEMPLARY EMBODIMENTS

Figure 1:
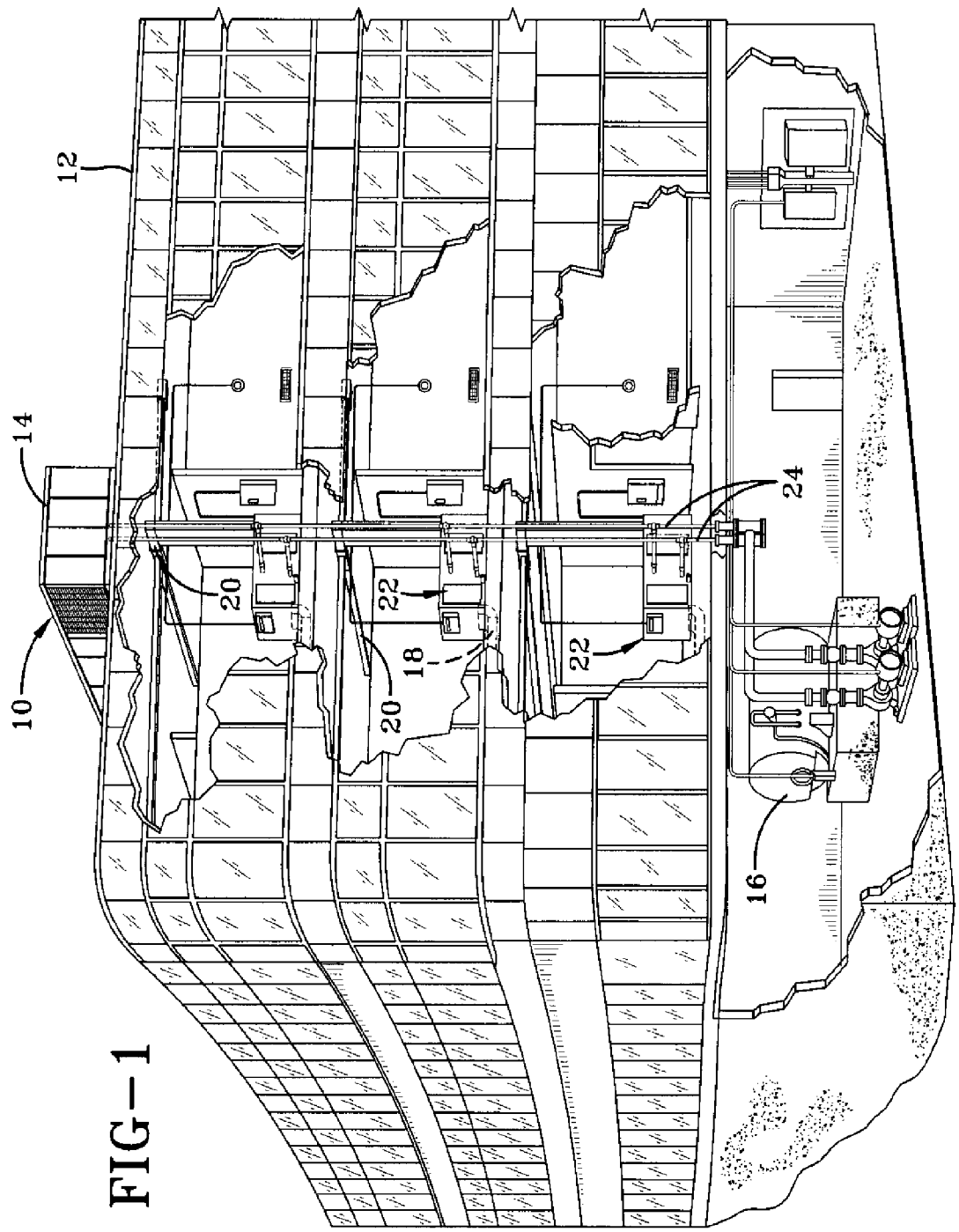
FIG. 1 shows an exemplary embodiment of a Heating, Ventilation, Air Conditioning and Refrigeration (HVAC&R) system in a commercial environment.

FIG. 1 shows an exemplary environment for a Heating, Ventilating, Air Conditioning system (HVAC system) 10 in a building 12 for a commercial setting. System 10 may include a compressor incorporated into a vapor compression system 14 that can supply a chilled liquid that may be used to cool building 12. System 10 can also include a boiler 16 used to heat building 12, and an air distribution system that circulates air through building 12. The air distribution system can include an air return duct 18, an air supply duct 20 and an air handler 22. Air handler 22 can include a heat exchanger that is connected to boiler 16 and vapor compression system 14 by conduits 24. The heat exchanger in air handler 22 may receive either heated liquid from boiler 16 or chilled liquid from vapor compression system 14, depending on the mode of operation of system 10. System 10 is shown with a separate air handler on each floor of building 12, but it will be appreciated that these components may be shared between or among floors.

Figure 2:
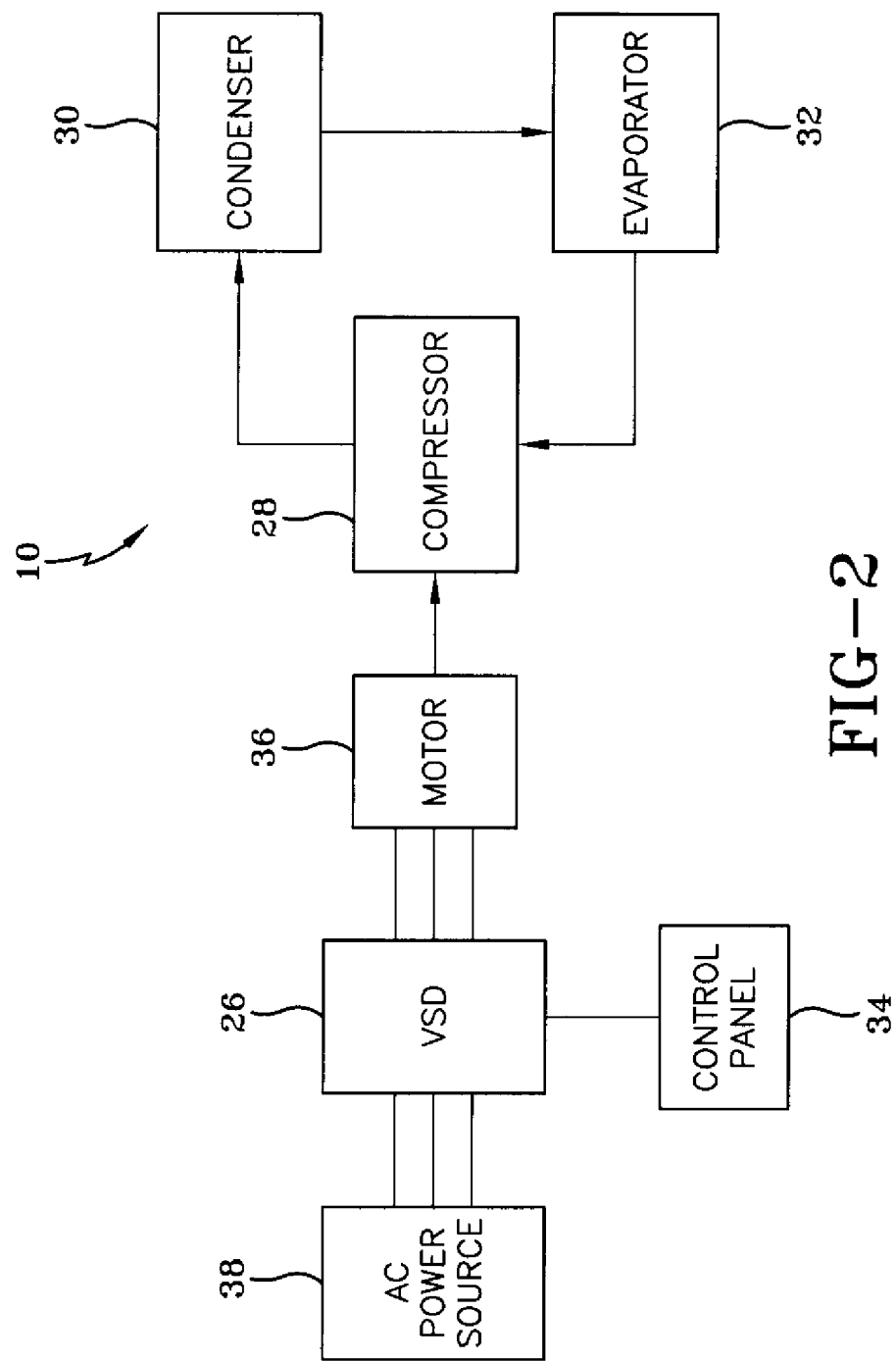
FIG. 2 schematically illustrates an exemplary embodiment of an HVAC&R System that may be used in the exemplary embodiment of FIG. 1.

FIG. 2 schematically illustrates an exemplary embodiment of system 14 with VSD 26 that may be used in building 12 in FIG. 1. System 10 may include compressor 28, a condenser 30, a liquid chiller or evaporator 32 and a control panel 34. Compressor 28 is driven by motor 36 that is powered by VSD 26. VSD 26 may be, for example, a vector-type drive or a variable-voltage, variable frequency (VVVF) drive. VSD 26 receives AC power having a particular fixed line voltage and fixed line frequency from AC power source 38 and provides AC power to motor 36 at desired voltages and desired frequencies, both of which can be varied to satisfy particular requirements. Control panel 34 can include a variety of different components, such as an analog to digital (A/D) converter, a microprocessor, a non-volatile memory, and an interface board, to control operation of system 10. Control panel 34 can also be used to control the operation of VSD 26, and motor 36.

Compressor 28 compresses a refrigerant vapor and delivers the vapor to condenser 30 through a discharge line. Compressor 28 can be any suitable type of compressor, for example, a screw compressor, a centrifugal compressor, a reciprocating compressor, a scroll compressor, etc. The refrigerant vapor delivered by compressor 28 to condenser 30 enters into a heat exchange relationship with a fluid, for example, air or water, and undergoes a phase change to a refrigerant liquid as a result of the heat exchange relationship with the fluid. The condensed liquid refrigerant from condenser 30 flows through an expansion device (not shown) to evaporator 32.

Evaporator 32 may include connections for a supply line and a return line of a cooling load. A secondary liquid, for example, water, ethylene, calcium chloride brine or sodium chloride brine, travels into evaporator 32 via return line and exits evaporator 32 via supply line. The liquid refrigerant in evaporator 32 enters into a heat exchange relationship with the secondary liquid to lower the temperature of the secondary liquid. The refrigerant liquid in evaporator 32 undergoes a phase change to a refrigerant vapor as a result of the heat exchange relationship with the secondary liquid. The vapor refrigerant in evaporator 32 exits evaporator 32 and returns to compressor 28 by a suction line to complete the cycle.

Figure 3:
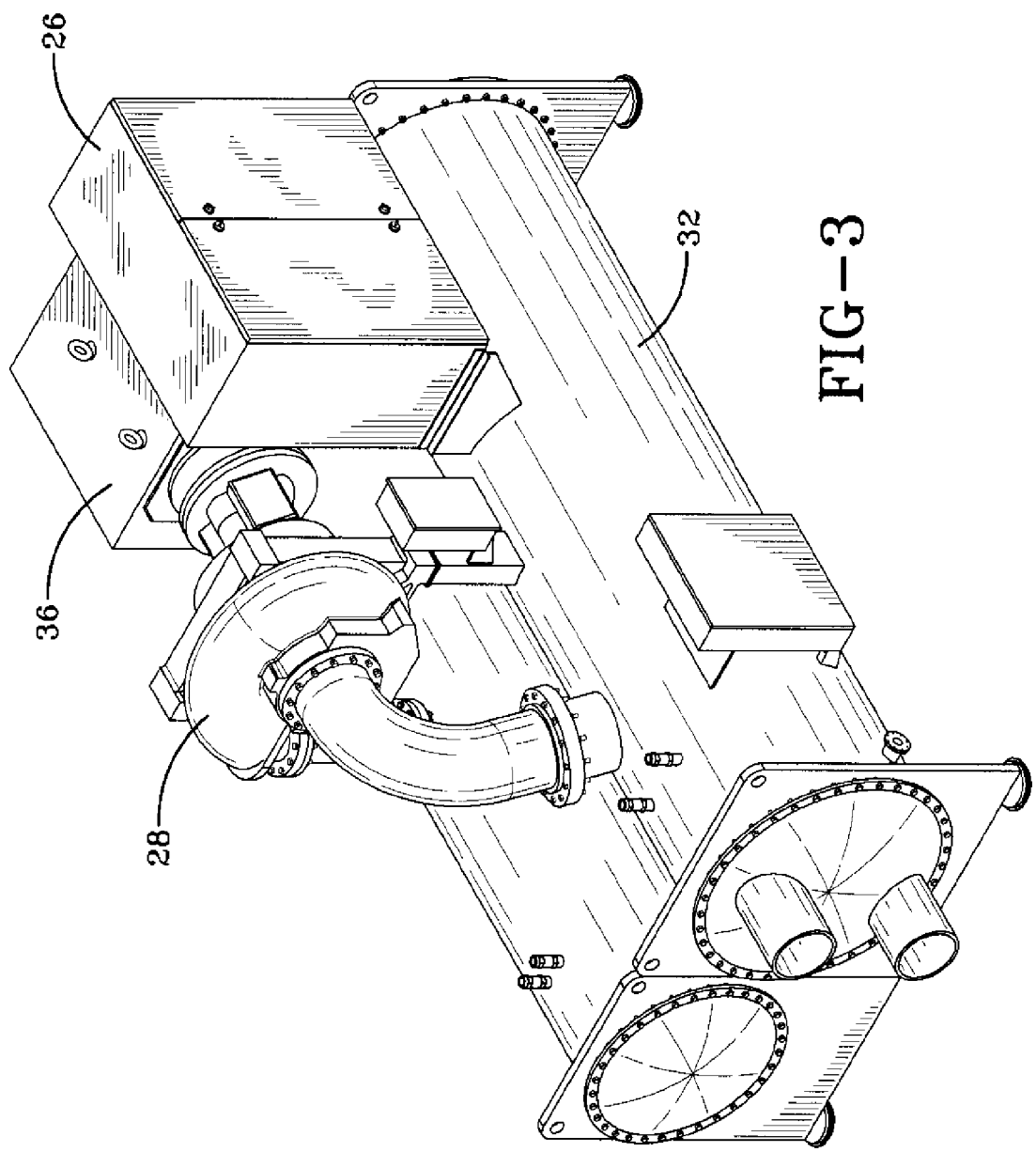
FIG. 3 shows an exemplary embodiment of a variable speed drive (VSD) mounted on a HVAC&R system.

FIG. 3 shows an exemplary vapor compression system of an HVAC&R system. The VSD 26 is mounted on top of the evaporator 32, and adjacent to motor 36, and control panel 34. Motor 36 may be mounted on condenser 30 on the opposite side of evaporator 32. Output wiring (not shown) from VSD 26 is connected to motor leads (not shown) for motor 36, to power motor 36, which drives compressor 28.

Figure 4:
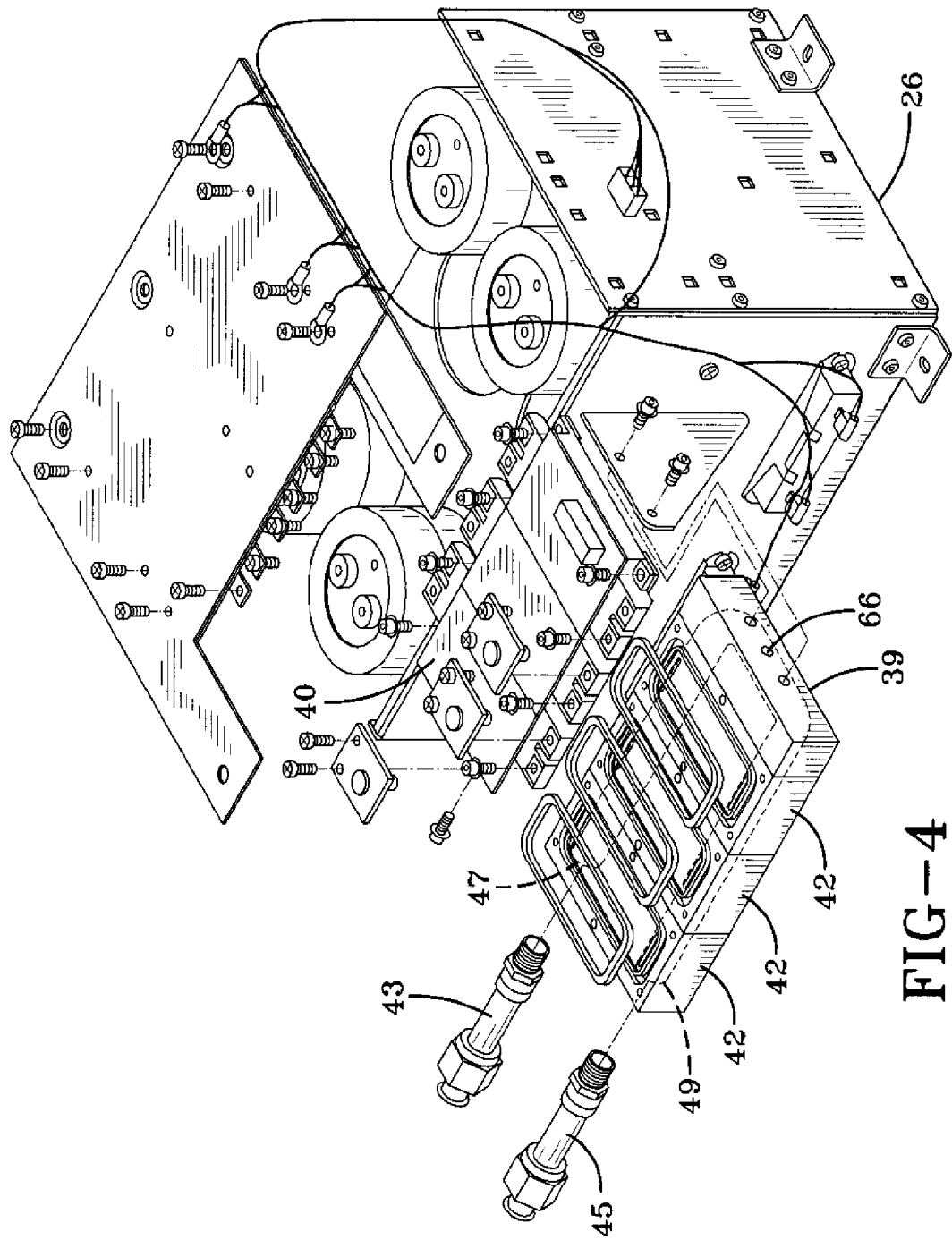
FIG. 4 shows an exemplary embodiment in a partially exploded view of a variable speed drive system with a heat sink.

FIG. 4 shows one part of a variable speed drive 26 with a plurality of power semiconductor modules or IGBT modules 40 that are arranged in thermal contact with a heat sink 42. VSD 26 may be used to provide desired power to motors for compressors or other equipment in HVAC systems or other applications. In an HVAC system, for example, a motor powered by VSD 26 may drive a compressor of a vapor compression system. In one embodiment modules 40 may contain 3 dual IGBT modules, such as manufactured by Infineon Technologies of Neubiberg, Germany, for implementing a three-phase converter or inverter of a VSD, although other semiconductor devices or other electronic components that require cooling for optimal operation could be cooled with heat sink 42. Cooling fluid conduits 43, 45 are connected to inlet passageway 47 and outlet passageway 49, respectively to introduce cooling fluid into heat sink 42. Conduits 43 and 45 are connected to a continuous source of cooling fluid to supply heat sink 42 with cooling fluid. A fluid such as water from condenser 30 flows into heat sink 42 through conduit 43 and exits heat sink 42 through conduit 45. An endplate 39 may be secured to a heat sink 42 at the end of a series of interconnected heat sinks 42, to direct the flow of fluid from conduit 43 to conduit 45.

Heat sink 42 removes heat from semiconductor modules 40 that power motor 36. Semiconductor modules 40 can be attached to heat sink 42 in a sealed relationship. The cooling fluid applied to heat sink 42 is preferably water that flows through heat sink 42 and a heat exchanger in a closed loop. The heat exchanger (not shown) reduces the fluid temperature before it is reintroduced to heat sink 42. The heat exchanger can be a shell and tube type heat exchanger where water from a cooling tower of the HVAC system is used to cool the water applied to heat sink 42.

Figure 5:
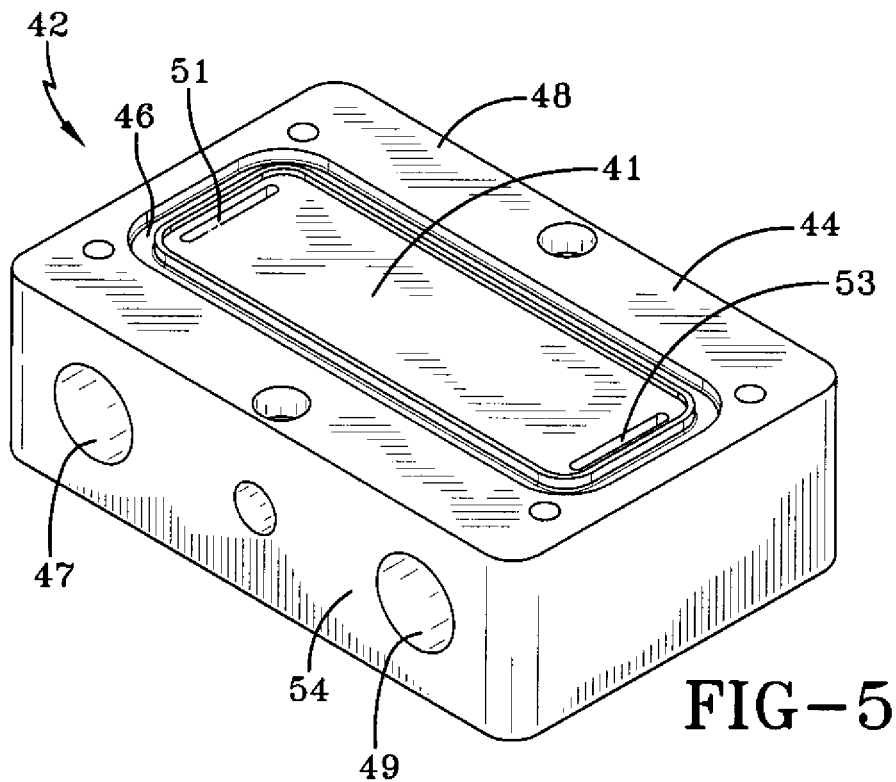
FIG. 5 shows a top perspective view of an exemplary embodiment of a heat sink in accordance with aspects of the application.
Figure 6:
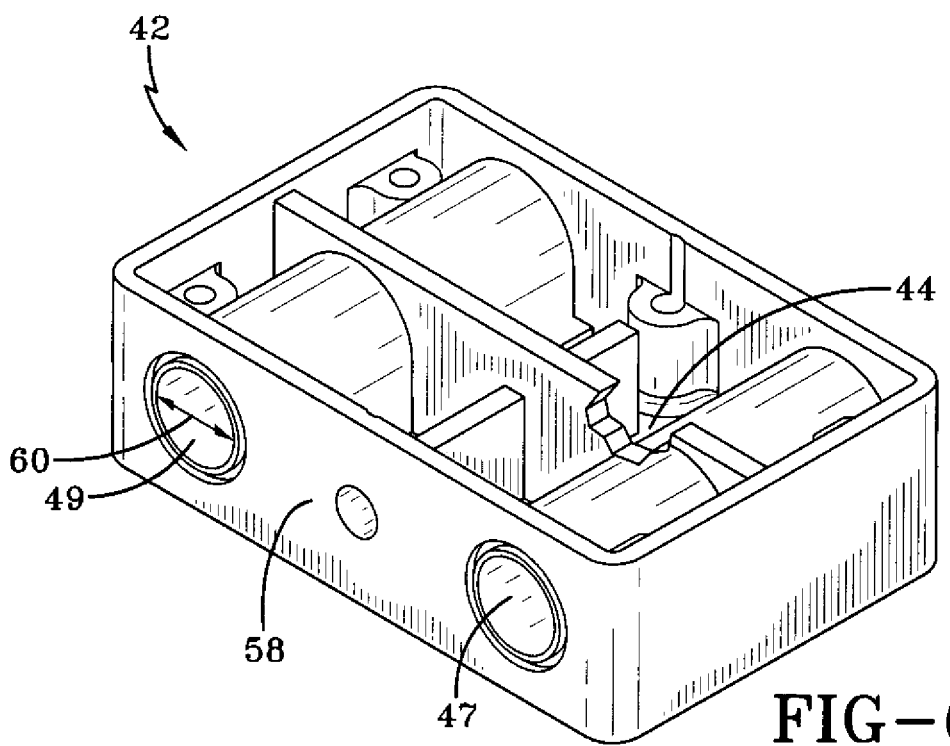
FIG. 6 shows a bottom perspective view of an exemplary embodiment of a heat sink in accordance with aspects of the application.

In one embodiment, shown in FIGS. 5 and 6, heat sink 42 includes a plastic body 44 having a channel 46 formed on a top surface 48. In alternate embodiments, heat sink 42 may be composed of other non-conductive materials such as ceramic or rubber. An electronic component, for example, a semiconductor switch or semiconductor module, can be mounted on top surface 48. Channel 46 formed on top surface 48 provides a space for an O-ring (not shown) to form a seal between a base 104 (see FIG. 7) and the component. Body 44 has an inlet passageway 47 that extends through body 44 and an outlet passageway 49 that extends through body 44. Passageways 47 and 49 have predetermined diameters 60, or cross sectional area for alternate profiles, that are sized to satisfy the flow rate and pressure drop requirements when multiple heat sinks 42 are used together. A liquid, for example, water from condenser 30, is circulated through passageways 47 and 49 to provide cooling to the component.

Body 44 has a tub 41 formed in top surface 48 for providing cooling to a component (not shown). A portion of cooling fluid flowing through inlet passageway 47 is diverted through a tub inlet 51, across tub 41, and discharged through a tub outlet 53. The cooling fluid then flows through outlet passageway 49. Fluid flowing across tub 41 is in direct contact with the base of a semiconductor module (not shown). The fluid exchanges heat with the base to cool the semiconductor module. Multiple heat sinks 42 may be connected together to accommodate multiple electronic components 40 and their associated bases 104.

Further details of the heat sink are disclosed in commonly owned U.S. patent application Ser. No. 12/057,787 filed Mar. 28, 2008, entitled "Cooling Member", which is hereby incorporated by reference in its entirety.

Figure 7:
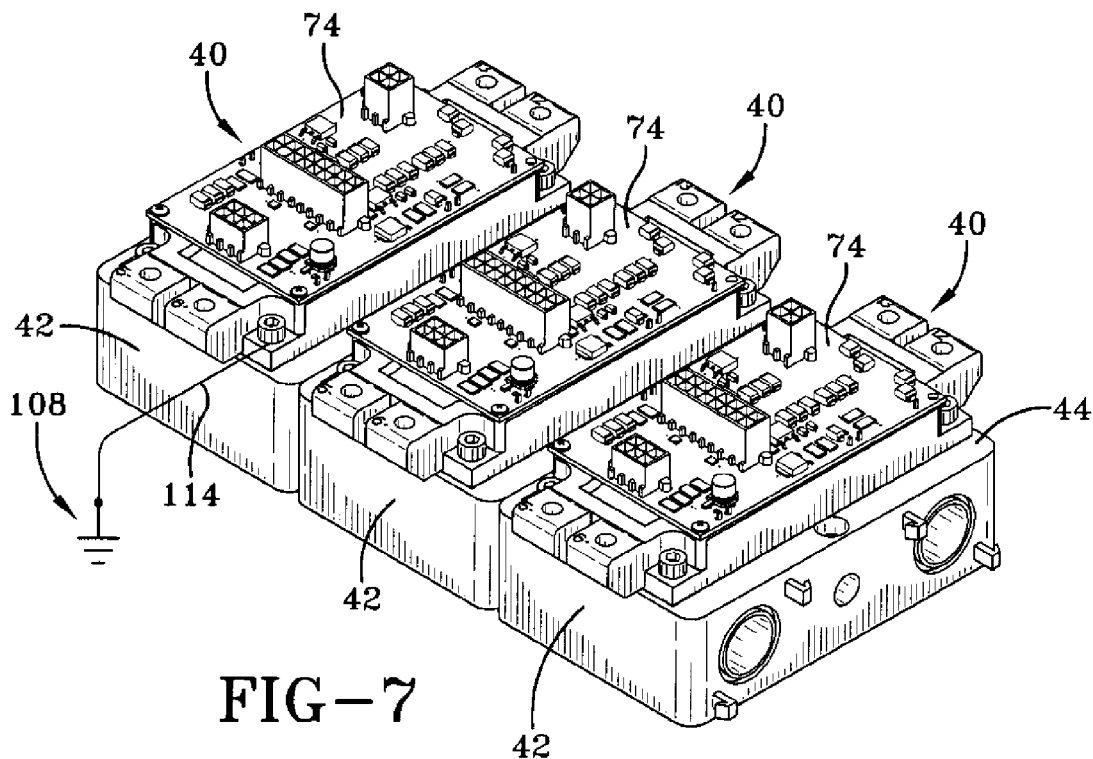
FIG. 7 shows a top perspective view of a portion of a VSD including printed circuit boards, semiconductor modules and heat sinks.

FIG. 7 illustrates a plurality of interconnected heat sinks 42 with corresponding components 74 mounted on heat sinks 42 for cooling. When a VSD (not shown) has more than one component 74, each component 74 is mounted to a corresponding heat sink 42. As shown, component 74 is a semiconductor module 40 with a circuit board 75. For example, if the VSD has four components 74, each component 74 is mounted to a separate heat sink 42 and each heat sink 42 is secured to an adjacent heat sink 42.

Figure 8:
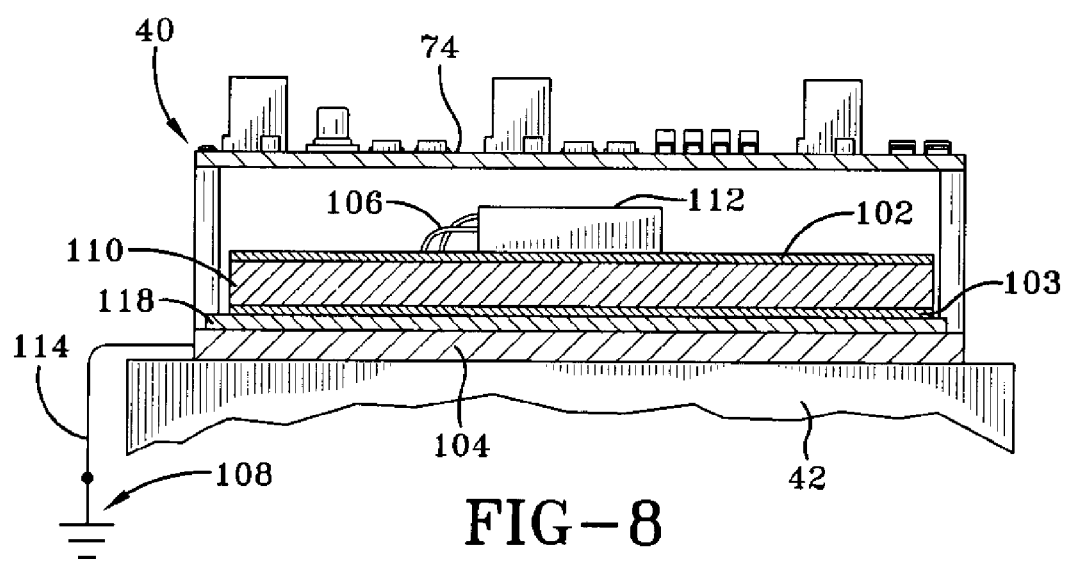
FIG. 8 shows a schematic cross-sectional view of a semiconductor module.

Referring next to FIG. 8, an embodiment is shown that eliminates electric charge that may accumulate between a base 104, and one or more copper conductors 106 disposed within semiconductor modules 40. Rapidly switching semiconductors modules 40 can achieve high quality output voltage and current on the output of the module, however, the rapid switching process of semiconductor modules 40 may induce parasitic current that flows through paths created by coupling capacitance within semiconductor modules 40. The induced parasitic currents may flow into control circuits of semiconductor module 40, and cause accidental switching of semiconductor device 112 to an ON state, provided that there is no grounding connection between base 104 of semiconductor module 40, and earth ground 108 or some other suitable voltage reference point. Accidental switching into the ON state can cause a short circuit connection between positive and negative terminals of semiconductor module 40, resulting in high current flow through semiconductor module 40, which may damage semiconductor module 40 and control circuits of VSD 26. Such a short-circuit condition in a semiconductor module 40 is commonly referred to as shoot-through current and should be prevented from occurring in a semiconductor module 40.

The configuration set forth in FIG. 8 substantially prevents electrical charge generated by circulating parasitic currents from building on semiconductor module 40. Semiconductor module 40 can include a substrate layer 110, a semiconductor device 112 mounted on substrate layer 110, and wire bonds 106 which provide flexible electric connections between semiconductor device 112 and internal semiconductor device conductors (not shown). A first layer 102 of conductive material is disposed between semiconductor device 112 and substrate layer 110, and a second layer 103 of conductive material is disposed between substrate layer 110 and base 104 of each semiconductor module 40. The conductive layer may be composed of, for example, copper, aluminum, gold, silver, and alloys thereof, or of an electroconductive plastic material. Base 104 is connected via one or more grounding conductors 114 to earth ground 108, or some other suitable voltage reference point, for example, the negative rail of the DC link. In one embodiment, second conductive material layer 103 may be connected to base 104 via solder 118. Substrate layer 110 is made from a nonconductive or insulating material. In one embodiment, the substrate layer may be a ceramic material, although many other nonconductive materials may be used to form substrate layer 110. The configuration of two layers 102, 103 of conductive material separated by a substrate 110 introduces a capacitance that couples semiconductor device 112 internal conductors and wire bonds 106 to grounded base 104. The additional conductive connection prevents electrical charge from accumulating between base 104 and conductive parts of semiconductor module 40, as well as between conductive parts of the semiconductor module resulting in significant reduction of the parasitic or circulating currents flowing inside the module and consequently prevents shoot-through currents from occurring in semiconductor modules 40.

While only certain features and embodiments of the invention have been illustrated and described, many modifications and changes may occur to those skilled in the art (for example, variations in sizes, dimensions, structures, shapes and proportions of the various elements, values of parameters (for example, temperatures, pressures, etc.), mounting arrangements, use of materials, colors, orientations, etc.) without materially departing from the novel teachings and advantages of the subject matter recited in the claims. It is, therefore, to be understood that the appended claims are intended to cover all such modifications and changes as fall within the true spirit of the invention. Furthermore, in an effort to provide a concise description of the exemplary embodiments, all features of an actual implementation may not have been described (i.e., those unrelated to the presently contemplated best mode of carrying out the invention, or those unrelated to enabling the claimed invention). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

What is claimed is:

1. A grounding system for a semiconductor module comprising:
   a first conductive layer connected to the semiconductor module;
   a second conductive layer;
   a substrate having a first surface and a second surface opposite the first surface, the substrate disposed between the first conductive layer and the second conductive layer, the substrate being electrically connected on the first surface to the first conductive layer and on the second surface to the second conductive layer, and a base connected to the second conductive layer, the base being electrically connectable to earth ground;
   the first conductive layer being separated from the second conductive layer by the substrate; and
   wherein the first conductive layer, the substrate and the second conductive layer form a capacitance path between the semiconductor module and the base to reduce parasitic currents generated in the semiconductor module.

2. The system of claim 1, wherein the semiconductor module is selected from the group consisting of n insulated gate bipolar transistor, (IGBT), bipolar junction transistors (BJT), metal-oxide semiconductor field-effect transistors (MOSFET), semiconductor controlled rectifier (SCR), and other three terminal semiconductor devices.

3. The system of claim 1, wherein the first conductive layer and the second layer are comprised of an electrically conductive metal selected from the group consisting of copper, aluminum, gold, silver, platinum and alloys thereof.

4. The system of claim 1, wherein the second conductive layer is affixed to the base by a solder connection about a portion of an interface edge.

5. The system of claim 1, wherein the substrate layer comprises a ceramic material.

6. The system of claim 1, wherein the substrate layer comprises a nonconductive material.

7. The system of claim 1, wherein the base is connected to earth ground by a conductor bonded at one end to the base and at an opposite end to the earth ground or other suitable voltage reference point.

8. A power semiconductor apparatus comprising:
   a semiconductor module and associated control circuitry mounted on a base;
   a nonconductive heat sink in thermal communication with the base and in fluid communication with a source of liquid; and
   a grounding assembly comprising;
      a first conductive layer, a second conductive layer; a substrate disposed between the first conductive layer and the second conductive layer; and a base attached to the second conductive layer, the base being connected to earth ground;
      the first conductive layer in electrical contact with the semiconductor module and the substrate, and electrically insulated from the second conductive layer by the substrate;
      the second conductive layer in electrical contact with the substrate and disposed between the substrate and the base in electrical communication with an earth ground;
   wherein the first conductive layer, the substrate and the second conductive layer form a capacitance path between the semiconductor module and the base for reducing circulating currents.

9. The apparatus of claim 8, wherein the heat sink further comprises:
   a body having a surface configured to receive the semiconductor module,
   a tub disposed on the surface of the base;
   a passageway formed in the base and configured to receive the liquid therethrough; and
   wherein a portion of the liquid flows through the passageway is diverted across the tub in thermal communication with the base to transfer heat to the liquid coolant from the semiconductor switch.

10. The apparatus of claim 8, wherein the semiconductor module is an insulated gate bipolar transistor.

11. The apparatus of claim 8, wherein the first conductive layer and the second layer are comprised of an electrically conductive metal.

12. The apparatus of claim 11, wherein the metal is selected from the group consisting of copper, aluminum, gold, silver, platinum and alloys thereof.

13. The apparatus of claim 8, wherein the second conductive layer is affixed to the base by a solder connection.

14. The apparatus of claim 8, wherein the substrate comprises a ceramic material.

15. The apparatus of claim 8, wherein the substrate comprises a nonconductive material.

16. The apparatus of claim 8, wherein base is connected to earth ground by a conductor.

17. A variable speed drive comprising:
   a converter connected to an AC power source, a DC link connected to the converter, and an inverter connected to the DC link, the inverter configured to convert a DC voltage from the DC link into an output AC power having a variable voltage and a variable frequency, the inverter further comprising:
   at least one semiconductor module and associated control circuitry mounted on a base;
   a nonconductive heat sink in thermal communication with the base and in fluid communication with a source of liquid; and
   a grounding assembly comprising;
      a first conductive layer capable of being electrically connected to the semiconductor module;
      a second conductive layer;
      a substrate disposed between the first conductive layer and the second conductive layer, the substrate being electrically connected to the first conductive layer and the second conductive layer; and a base connected to the second conductive layer, the base being electrically connected to earth ground, and the base being electrically connected to the second conductive layer;
      the first conductive layer being electrically insulated from the second conductive layer by the substrate; and
   wherein the first conductive layer, the substrate and the second conductive layer form a capacitance path between the semiconductor module and the base to reduce circulating currents in the semiconductor module.

18. The system of claim 17, wherein the semiconductor module is an insulated gate bipolar transistor.

19. The system of claim 17, wherein the second conductive layer is affixed to the base by a solder connection.

* * * * *